(12) United States Patent
Sakamoto

(10) Patent No.: US 9,117,770 B2
(45) Date of Patent: Aug. 25, 2015

(54) SEMICONDUCTOR DEVICE

(71) Applicant: Panasonic Corporation, Osaka (JP)

(72) Inventor: Takeshi Sakamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 54 days.

(21) Appl. No.: 14/149,890

(22) Filed: Jan. 8, 2014

(65) Prior Publication Data

US 2014/0124941 A1    May 8, 2014

Related U.S. Application Data

(63) Continuation of application No. PCT/JP2012/005629, filed on Sep. 5, 2012.

(30) Foreign Application Priority Data

Oct. 21, 2011   (JP) .................................. 2011-232064

(51) Int. Cl.
*H01L 23/498* (2006.01)
*H01L 23/31* (2006.01)
(Continued)

(52) U.S. Cl.
CPC ...... *H01L 23/3114* (2013.01); *H01L 23/49838* (2013.01); *H01L 23/528* (2013.01); *H01L 24/19* (2013.01); *H01L 25/0657* (2013.01); *H01L 23/3121* (2013.01); *H01L 23/5389* (2013.01); *H01L 24/05* (2013.01); *H01L 24/13* (2013.01); *H01L 24/16* (2013.01); *H01L 24/32* (2013.01); *H01L 24/48* (2013.01); *H01L 24/73* (2013.01); *H01L 2224/02375* (2013.01);

(Continued)

(58) Field of Classification Search
CPC .... H01L 23/482; H01L 25/162; H01L 23/562
USPC .......................................... 257/692, 735, 775
See application file for complete search history.

(56) References Cited

U.S. PATENT DOCUMENTS 4,280,273 A *   7/1981   Vincent ........................... 438/28
7,208,344 B2 *  4/2007   Ho ................................. 438/107
(Continued)

FOREIGN PATENT DOCUMENTS

JP    62-169458    7/1987
JP    2000-183231  6/2000
(Continued)

OTHER PUBLICATIONS

International Search Report of PCT Application No. PCT/JP2012/005629 dated Nov. 13, 2012.

*Primary Examiner* — George Fourson, III
(74) *Attorney, Agent, or Firm* — Panasonic Patent Center

(57) ABSTRACT

A semiconductor device includes a first base material having a first surface; a second base material having a coefficient of linear expansion different from that of the first base material, being in contact with the first base material, and having a second surface being adjacent to the first surface; and a first interconnect formed over the first and second surfaces to straddle a borderline between the first and second base materials. The cross-sectional area of the first interconnect along the borderline is greater than the cross-sectional area of at least part of a portion of the first interconnect on the first surface along a width of the first interconnect, or the cross-sectional area of at least part of a portion of the first interconnect on the second surface along the width of the first interconnect.

20 Claims, 7 Drawing Sheets

(51) Int. Cl.
*H01L 25/065* (2006.01)
*H01L 23/528* (2006.01)
*H01L 23/00* (2006.01)
*H01L 23/538* (2006.01)

(52) U.S. Cl.
CPC ........ *H01L 2224/02379* (2013.01); *H01L 2224/0401* (2013.01); *H01L 2224/04042* (2013.01); *H01L 2224/04105* (2013.01); *H01L 2224/05569* (2013.01); *H01L 2224/05571* (2013.01); *H01L 2224/12105* (2013.01); *H01L 2224/131* (2013.01); *H01L 2224/13144* (2013.01); *H01L 2224/16145* (2013.01); *H01L 2224/32225* (2013.01); *H01L 2224/48227* (2013.01); *H01L 2224/73207* (2013.01); *H01L 2224/73265* (2013.01); *H01L 2225/0651* (2013.01); *H01L 2225/06513* (2013.01); *H01L 2225/06527* (2013.01); *H01L 2225/06568* (2013.01); *H01L 2924/00014* (2013.01); *H01L 2924/01029* (2013.01); *H01L 2924/15311* (2013.01); *H01L 2924/15313* (2013.01); *H01L 2924/15787* (2013.01); *H01L 2924/15788* (2013.01); *H01L 2924/19107* (2013.01)

(56) References Cited

U.S. PATENT DOCUMENTS

| | | | | |
|---|---|---|---|---|
| 7,208,345 | B2 * | 4/2007 | Meyer et al. | 438/109 |
| 2006/0220213 | A1 * | 10/2006 | Kondou et al. | 257/690 |
| 2008/0135155 | A1 | 6/2008 | Kawamura et al. | |
| 2009/0085186 | A1 * | 4/2009 | Meyer | 257/690 |
| 2009/0102002 | A1 * | 4/2009 | Chia et al. | 257/433 |
| 2009/0115073 | A1 * | 5/2009 | Sunohara et al. | 257/778 |
| 2009/0283870 | A1 * | 11/2009 | Pagaila et al. | 257/620 |
| 2010/0053921 | A1 * | 3/2010 | Miyagawa | 361/767 |
| 2010/0230822 | A1 * | 9/2010 | Pagaila et al. | 257/773 |
| 2014/0117531 | A1 * | 5/2014 | Mahler et al. | 257/734 |

FOREIGN PATENT DOCUMENTS

| | | | |
|---|---|---|---|
| JP | 2002-43762 | 2/2002 | |
| JP | 2002076199 A * | 3/2002 | ............ H01L 23/28 |
| JP | 2006-253217 | 9/2006 | |
| JP | 2011-151104 | 8/2011 | |
| WO | 2007/138826 | 12/2007 | |

\* cited by examiner

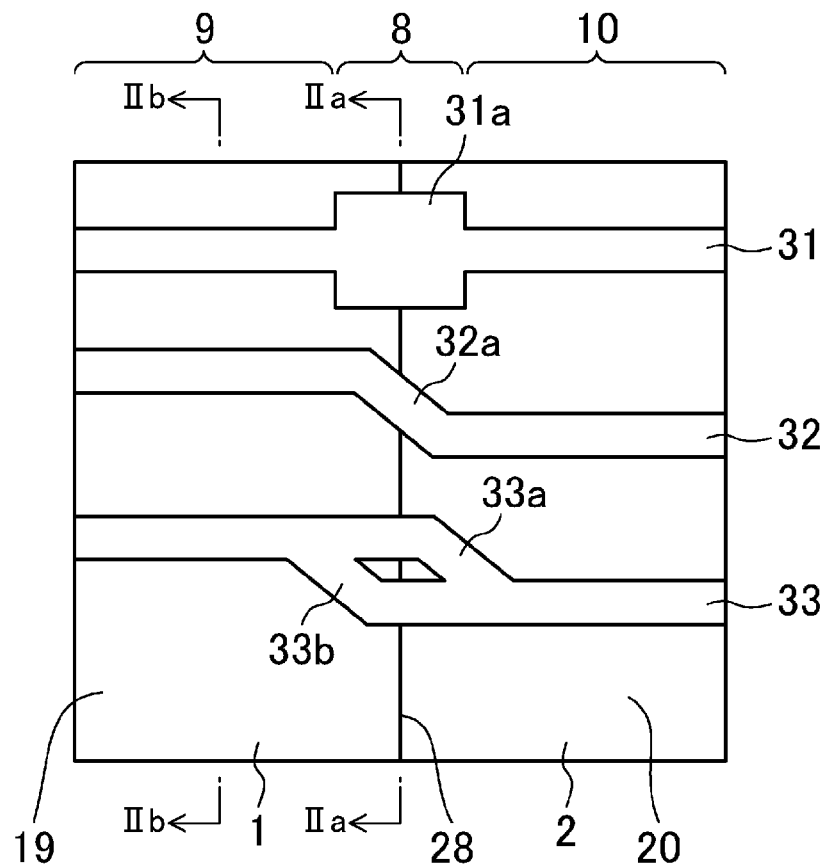
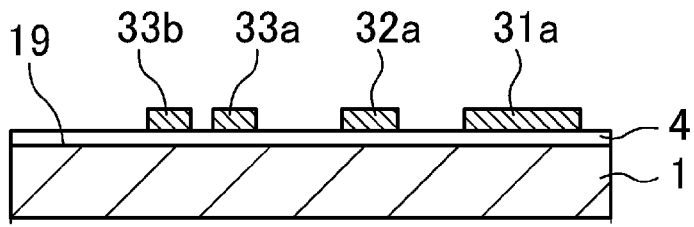
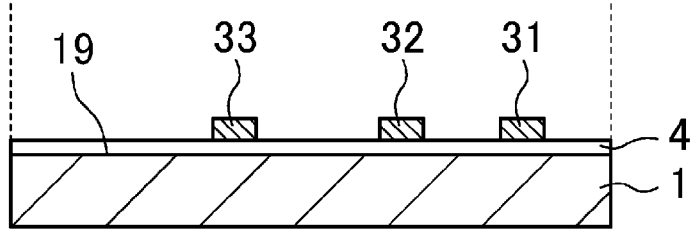

SEMICONDUCTOR DEVICE

CROSS-REFERENCE TO RELATED APPLICATIONS

This is a continuation of International Application No. PCT/JP2012/005629 filed on Sep. 5, 2012, which claims priority to Japanese Patent Application No. 2011-232064 filed on Oct. 21, 2011. The entire disclosures of these applications are incorporated by reference herein.

BACKGROUND

The present disclosure relates to interconnects on substrates and semiconductor packages, and more particularly relates to a semiconductor device including an interconnect extending over different base materials.

In the fields of semiconductor packages, with increasing miniaturization of transistors each formed on a semiconductor chip, the area of the semiconductor chip continues decreasing. Furthermore, with downsizing of devices including a semiconductor package, such as mobile phones, there has been an increasing demand to further downsize semiconductor packages.

To address this demand, wafer level packages (WLPs) or wafer level chip size packages (WL-CSPs) that can be each placed on a printed circuit board with the size of the semiconductor package kept small have been developed. A so-called redistribution layer is formed on each of semiconductor chips at the wafer level, and a solder ball is placed on an electrode connected to the redistribution layer. In this state, the wafer is singulated into semiconductor packages. Such semiconductor packages are referred to as WLPs. The WLPs allow the size of each of the semiconductor packages to be substantially equal to that of each of the semiconductor chips.

However, with increasing functionality required of semiconductor chips, the number of input/output terminals of a semiconductor package increases, and a WLP having a small area cannot include all terminals.

To address this problem, fan out WLPs have been proposed. The fan out WLPs are semiconductor packages that each include an extension surrounding a semiconductor chip and made of a material such as an epoxy resin, a redistribution interconnect extending from immediately above an electrode on the semiconductor chip to immediately above the extension, and solder balls on the semiconductor chip surface including the extension surface. Such semiconductor packages ensure the required number of terminals.

The fan out WLP includes an interconnect straddling the borderline between the principal surface of the semiconductor chip and the principal surface of an epoxy resin body. In addition to the fan out WLP, a semiconductor package that includes a semiconductor chip embedded in a recess formed in a glass epoxy resin substrate also includes an interconnect straddling the borderline between the principal surface of the semiconductor chip and the principal surface of a printed circuit board.

Japanese Unexamined Patent Publication No. 2000-183231 describes a package including an interconnect provided over two different base materials.

FIG. 10 is a perspective view illustrating the configuration of a conventional semiconductor device described in Japanese Unexamined Patent Publication No. 2000-183231. As illustrated in FIG. 10, the conventional semiconductor device includes a semiconductor chip 106 that is flip-chip bonded onto a circuit board 101.

A surface of the circuit board 101 includes circuit sections 103, and a surface of the semiconductor chip 106 includes chip junction portions 107. Interconnects 102 and 104a and junction interconnect portions 104 are formed on the surface of the circuit board 101 so as to be each electrically connected to a corresponding one of the circuit sections 103. The junction interconnect portions 104 are each provided on a corresponding one of low dielectric constant materials 105.

The semiconductor chip 106 is bonded onto the circuit board 101 such that the surface of the circuit board 101 including the circuit sections 103 faces the surface of the semiconductor chip 106 including circuits. In this case, the semiconductor chip 106 is placed on the circuit board 101 such that the chip junction portions 107 each overlap a corresponding one of the junction interconnect portions 104.

SUMMARY

When a semiconductor package or a substrate including an interconnect is practically used as a product, the semiconductor package or the substrate is heated and cooled to repeatedly undergo changes in temperature. Materials forming a semiconductor device have a coefficient of linear expansion (CLE) specific to heat. Here, the coefficient of linear expansion denotes the amount of expansion of a material along the length thereof per unit temperature.

When the temperature of a semiconductor device has changed, the amounts of expansion or contraction of materials having different CLEs (for example, the circuit board 101 and the low dielectric constant material 105 illustrated in FIG. 10) are different from each other. This difference induces a strain at the interface at which the materials having different CLEs are in contact with each other. Thus, when an interconnect is provided over base materials having different CLEs to straddle the borderline therebetween, a change in temperature of the semiconductor device produces a stress on the interconnect due to the strain at the interface. When the semiconductor device repeatedly undergoes changes in temperature, strain is accumulated in the interconnect, and the interconnect may be finally broken.

When an interconnect is formed over different base materials to straddle the borderline therebetween, a semiconductor device of the present disclosure can reduce the possibility that the interconnect may be broken.

In order to solve the problem, in the semiconductor device of the present disclosure, an interconnect is formed over base materials having different CLEs, and the cross-sectional area of a portion of the interconnect on a boundary region of the base materials is increased to improve the strength of the interconnect against strains induced on the boundary region of the base materials.

Specifically, an example semiconductor device according to the present disclosure includes: a first base material having a first surface on which a circuit is formed; a second base material having a CLE different from that of the first base material, being in contact with the first base material, and having a second surface being adjacent to the first surface and facing in a direction identical with a direction in which the first surface faces; and a first interconnect formed over the first and second surfaces to straddle a first borderline between the first and second base materials when viewed in plan, and connected to the circuit formed on the first surface. Furthermore, a cross-sectional area of the first interconnect along the first borderline is greater than a cross-sectional area of at least part of a portion of the first interconnect on the first surface along a width of the first interconnect, or a cross-sectional area of at least part of a portion of the first interconnect on the second surface along the width of the first interconnect.

Here, the situation where "the first and second surfaces face in an identical direction" includes errors arising from thermal expansion of the base materials and variations among fabricated base materials. The first and second surfaces may be adjacent to each other while having different heights without interfering with the formation of the interconnect.

The configuration above increases the cross-sectional area of a portion of the first interconnect on the boundary region to improve the strength of the interconnect. Thus, even when changes in temperature cause misalignment between the first and second base materials or a strain at the interface between the first and second base materials, the possibility that the interconnect may be broken can be reduced. This further improves the reliability of the semiconductor device.

Such a configuration of the interconnect can be used also in a so-called fan out WLP and a semiconductor package including the fan out WLP, and significantly contributes to improvement in reliability of such semiconductor devices. When such a configuration is used in a fan out WLP, the first base material is a semiconductor chip, the second base material is an extension member, and the first interconnect is a so-called redistribution interconnect.

As described above, the example semiconductor device according to the present disclosure can reduce the possibility that an interconnect formed over different base materials to straddle the borderline between the different base materials may be, for example, broken.

BRIEF DESCRIPTION OF THE DRAWINGS

FIG. 1 is a plan view illustrating an example semiconductor device according to an embodiment of the present disclosure.

FIG. 2A is a cross-sectional view of the semiconductor device of this embodiment taken along the line IIa-IIa illustrated in FIG. 1, and FIG. 2B is a cross-sectional view of the semiconductor device taken along the line IIb-IIb illustrated in FIG. 1.

DETAILED DESCRIPTION

Embodiment

Figure 3:
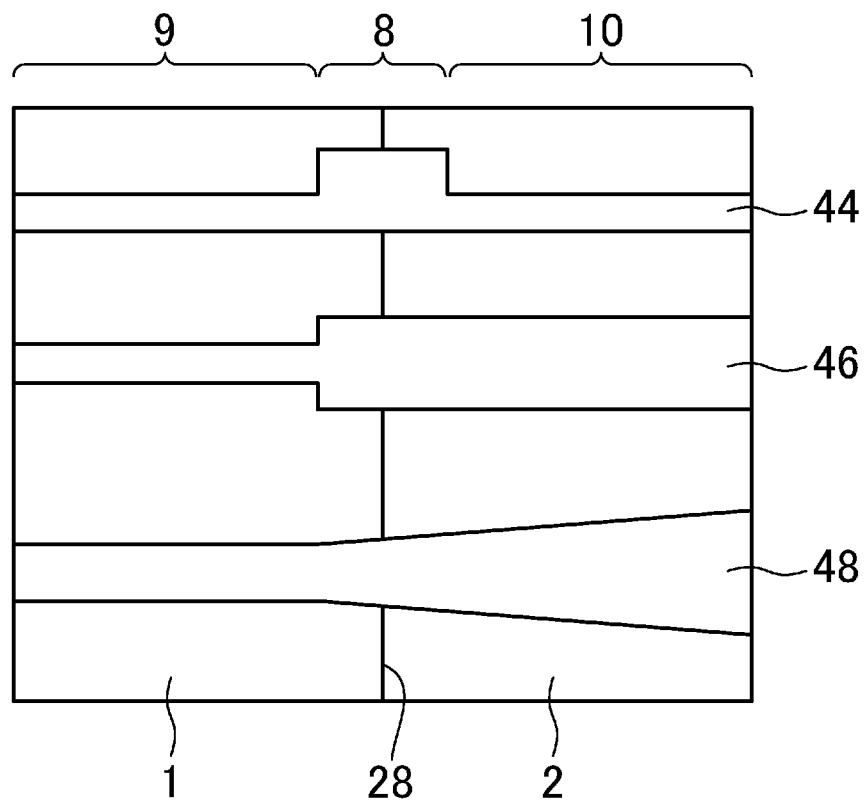
FIG. 3 is a plan view illustrating another example semiconductor device according to the embodiment of the present disclosure.

An embodiment of the present disclosure will be described hereinafter with reference to the drawings. FIG. 1 is a plan view illustrating a semiconductor device according to the embodiment of the present disclosure. FIG. 2A is a cross-sectional view of the semiconductor device of this embodiment taken along the line IIa-IIa illustrated in FIG. 1, and FIG. 2B is a cross-sectional view of the semiconductor device taken along the line IIb-IIb illustrated in FIG. 1.

As illustrated in FIG. 1, the semiconductor device of this embodiment includes a base material 1, a base material 2, and interconnects 31, 32, and 33. The base material 2 is in contact with the base material 1, and has a principal surface 20 being adjacent to a principal surface 19 of the base material 1 and facing in a direction identical with the direction in which the principal surface 19 faces. The interconnects 31, 32, and 33 are each provided over the principal surface 19 of the base material 1 and the principal surface 20 of the base material 2 to straddle a borderline 28 between the base materials 1 and 2 when viewed in plan. The borderline 28 here is the borderline between the principal surfaces 19 and 20.

The base materials 1 and 2 are materials having different coefficients of linear expansion (CLEs). The base materials 1 and 2 may be each a semiconductor chip made of, e.g., silicon (Si), or an epoxy resin substrate made of, e.g., an FR4 resin, an FR5 resin, or a bismaleimide triazine (BT) resin. The base materials 1 and 2 may be, for example, an epoxy encapsulating resin, ceramic, glass, a metal such as copper or gold, a solid material obtained by plating the epoxy encapsulating resin, ceramic, glass, or the metal, or an alloy, and are not limited as long as they are solid objects having different CLEs. Note that the base materials 1 and 2 may be plate-like in shape. The principal surfaces 19 and 20 may be flush with each other. Alternatively, the heights of the principal surfaces 19 and 20 may be different from each other as long as the interconnects can be formed directly on the principal surfaces or on the principal surfaces with an insulating protective film interposed between the interconnects and the principal surfaces.

At least one of the base materials 1 and 2 may include circuits (not shown) electrically connected to the interconnects 31, 32, and 33. The circuits may be formed on the principal surface 19 or 20.

The interconnects 31, 32, and 33 are metal interconnects made of, e.g., copper or aluminum. When the base materials 1 and 2 are made of an insulating material, the interconnects 31, 32, and 33 may be provided directly on the base materials 1 and 2. However, when the base materials 1 and 2 are made of at least a conductive material or a semiconductor, the interconnects 31, 32, and 33 are provided on the base materials 1 and 2 with an insulating protective film 4 interposed between the interconnects 31, 32, and 33 and the base materials 1 and 2 as illustrated in FIGS. 2A and 2B. To clearly show the borderline between the base materials 1 and 2, the insulating protective film 4 is not shown in FIG. 1.

As illustrated in FIGS. 1, 2A, and 2B, in the semiconductor device of this embodiment, the cross-sectional area of the interconnect 31 along the borderline 28 is greater than the cross-sectional area of at least part of a portion of the interconnect 31 on the principal surface 19 along the interconnect width, and/or the cross-sectional area of at least part of a portion of the interconnect 31 on the principal surface 20 along the interconnect width.

The cross-sectional area of the interconnect 32 along the borderline 28 is also greater than the cross-sectional area of at least part of a portion of the interconnect 32 on the principal surface 19 along the interconnect width, and/or the cross-sectional area of at least part of a portion of the interconnect 32 on the principal surface 20 along the interconnect width, and the cross-sectional area of the interconnect 33 along the borderline 28 is also greater than the cross-sectional area of at least part of a portion of the interconnect 33 on the principal surface 19 along the interconnect width, and/or the cross-sectional area of at least part of a portion of the interconnect 33 on the principal surface 20 along the interconnect width.

Specifically, the width of a portion of the interconnect 31 on a boundary region 8 including the borderline 28 (i.e., an interconnect widening portion 31a) is greater than that of a portion of the interconnect 31 on each of non-boundary regions 9 and 10. Here, the boundary region 8 denotes a region of a group of the principal surfaces 19 and 20 near the borderline 28, and the non-boundary regions 9 and 10 denote regions of the principal surfaces 19 and 20, respectively, except the boundary region 8. The non-boundary regions 9 and 10 are away from the borderline 28. The boundaries of the boundary region 8 are optionally determined by the design of the semiconductor device.

The direction of extension of a portion 32a of the interconnect 32 on the boundary region 8 including the borderline 28 is not orthogonal to the borderline 28. In the example illustrated in FIG. 1, the portion 32a extends obliquely relative to the direction of extension of portions of the interconnect 32 on the non-boundary regions 9 and 10.

The interconnect 33 branches into a plurality of interconnects (in FIG. 1, two interconnects) on the boundary region 8 including the borderline 28. Thus, the sum of the cross-sectional area of a branch portion 33a of the interconnect 33 along the borderline 28 and the cross-sectional area of a branch portion 33b of the interconnect 33 along the borderline 28 is greater than the cross-sectional area of a portion of the interconnect 33 on each of the non-boundary regions 9 and 10 along the interconnect width.

To fabricate the semiconductor device of this embodiment, base materials 1 and 2 are first bonded together. In this case, when one of the base materials is made of a resin material such as an epoxy resin, curing of the resin allows both the base materials to be bonded together. When the base materials are made of silicon, ceramic, or a metal such as copper, the base materials may be bonded together using an adhesive, or a recess may be formed in one of the base materials, and the other base material may be embedded in the recess. Alternatively, while the back surfaces of both the base materials are fixed with a tape, a principal surface 19 of the base material 1 and a principal surface 20 of the base material 2 may be coated with a protective film made of polyimide to bond both the base materials together.

Next, if necessary, electrodes are formed on the principal surfaces 19 and 20. Subsequently, an insulating protective film 4 is formed on the principal surfaces 19 and 20 of the base materials 1 and 2 by, for example, spin coating. The thickness of the insulating protective film 4 is not specifically limited. However, the thickness of the insulating protective film 4 here is, for example, about 5 μm. Subsequently, portions of the insulating protective film 4 are etched away to form openings on the electrodes (not shown) provided on the principal surfaces 19 and 20 of the base materials 1 and 2. Next, interconnects 31, 32, and 33 shaped as described above are formed by, for example, a subtractive process or an additive process. In the foregoing manner, the semiconductor device of this embodiment can be fabricated.

This method merely requires changing the shapes of, e.g., masks for use in the formation of interconnects, and enables the fabrication of the semiconductor device of this embodiment without causing the number of process steps to be greater than that for a conventional semiconductor device.

As described above, in the semiconductor device of this embodiment, the cross-sectional areas of the interconnects 31, 32, and 33 along the borderline 28 are respectively greater than the cross-sectional areas of portions of the interconnects 31, 32, and 33 on each of the non-boundary regions 9 and 10 along the interconnect widths. Thus, even when the semiconductor device undergoes changes in temperature, and the changes in temperature induce misalignment between the base materials 1 and 2 or a strain at the interface therebetween, the interconnects are less likely to be broken.

Figure 10:
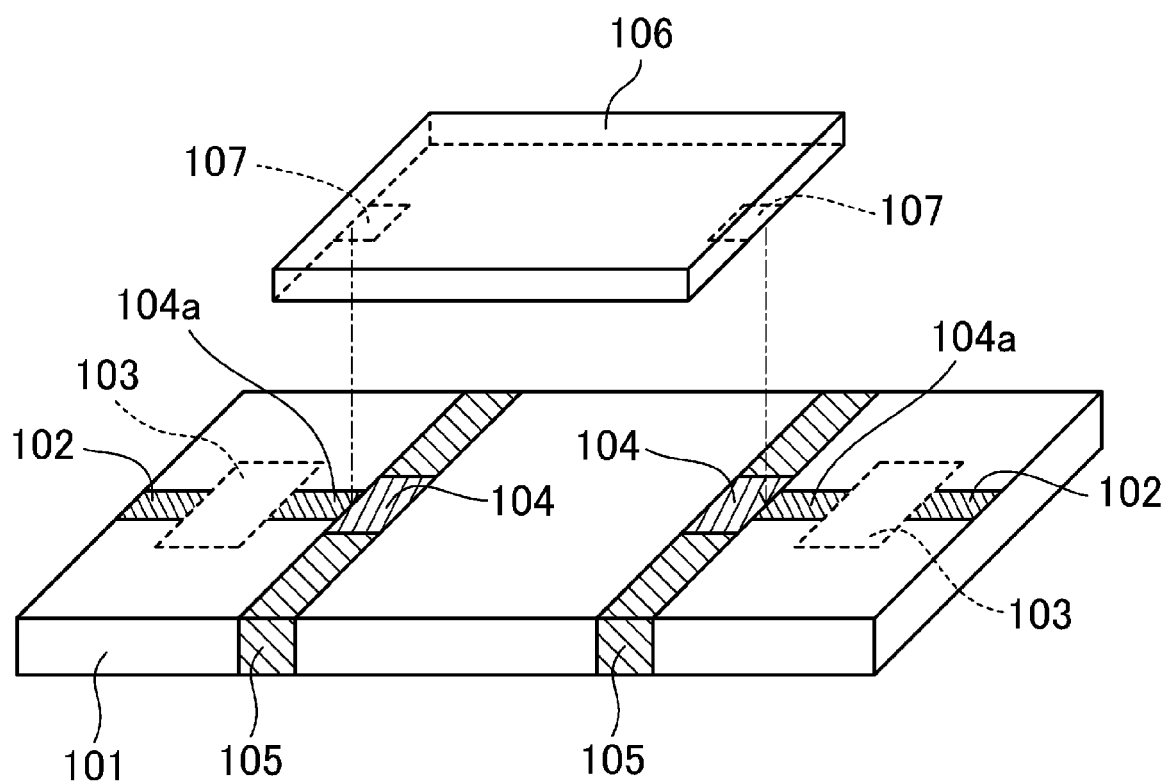
FIG. 10 is a perspective view illustrating the configuration of a conventional semiconductor device.

In contrast to this, in the conventional semiconductor device illustrated in FIG. 10, the cross-sectional area of the joint between each of the interconnects 104a and a corresponding one of the junction interconnect portions 104 along the borderline between the top surface of the circuit board 101 and the top surface of a corresponding one of the low dielectric constant materials 105 is less than the cross-sectional area of the corresponding one of the junction interconnect portions 104. The width of the interconnect 104a on the circuit board 101 is less than that of the junction interconnect portion 104 on the low dielectric constant material 105. Thus, in the conventional semiconductor device, the interconnects 104a tend to be subject to stress, such as strains arising from changes in temperature, on the borderlines between the top surface of the circuit board 101 and the top surfaces of the low dielectric constant materials 105.

As such, in the semiconductor device of this embodiment, the cross-sectional area of a portion of an interconnect on the boundary region is greater than that of the conventional semiconductor device, and the interconnect strength, therefore, increases. Thus, even when the semiconductor device repeatedly undergoes changes in temperature, the interconnect is less likely to be broken, and the reliability of the semiconductor device is further improved.

Since, in particular, the interconnect 31 has the interconnect widening portion 31a on the boundary region 8, the strength of a portion of the interconnect 31 on the boundary region 8 significantly increases.

While the strength of a portion of the interconnect 32 on the boundary region 8 of the principal surfaces 19 and 20 increases, the width of the interconnect 32 does not vary across the entire interconnect 32. This can prevent a reduction in interconnect density.

Since the interconnect 33 branches into the plurality of branch portions 33a and 33b on the boundary region 8, this increases the cross-sectional area of the interconnect 33 along the borderline 28, thereby improving the interconnect strength. Furthermore, even when any one of the branch portions 33a and 33b is broken, the other one thereof is electrically continuous. Thus, the interconnect 33 is less likely to be defective.

The shape of a portion of an interconnect on the boundary region 8 when viewed in plan is not limited to the shape of a portion of each of the interconnects 31, 32, and 33 thereon when viewed in plan. For example, corners of the interconnect widening portion 31a may be rounded when viewed in plan, or the width of the obliquely extending portion 32a of the interconnect 32 may be greater than that of each of the other portions thereof. Alternatively, the branch portions 33*a* and 33*b* of the interconnect 33 may each have an obliquely extending portion.

Furthermore, all of one or more interconnects 31, one or more interconnects 32, and one or more interconnects 33 may be provided on the base materials 1 and 2, or one or two of the interconnects 31, 32, and 33 may be provided thereon.

FIG. 3 is a plan view illustrating another example semiconductor device according to the embodiment of the present disclosure.

Similarly to an interconnect 44 illustrated in FIG. 3, an interconnect provided over base materials 1 and 2 may have a portion located on a borderline 28 between the base materials 1 and 2 and having a width that increases only in one of directions along the interconnect width. Furthermore, similarly to an interconnect 46, the cross-sectional area of an interconnect along the borderline 28 may be greater than the cross-sectional area of at least part of a portion of the interconnect on at least one of the base materials 1 and 2 along the interconnect width. In other words, the cross-sectional area of the interconnect along the borderline 28 merely needs to be greater than the cross-sectional area of at least part of a portion of the interconnect located on one of the base materials along the interconnect width. In this case, similarly to an interconnect 48, with increasing distance from the borderline 28, the width of a portion of an interconnect on the other one of the base materials 1 and 2 may increase such that the portion of the interconnect thereon extends radially outward.

—Variation of Semiconductor Device—

Figure 4:
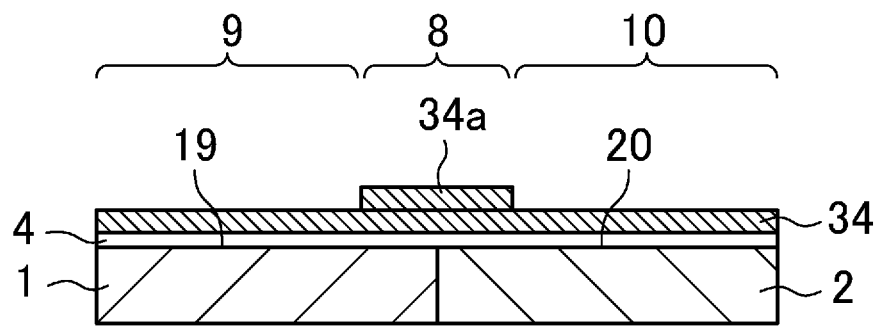
FIG. 4 is a cross-sectional view illustrating a variation of the semiconductor device illustrated in FIG. 1.

FIG. 4 is a cross-sectional view illustrating a variation of the semiconductor device according to the embodiment of the present disclosure. FIG. 4 illustrates a cross section passing through an interconnect 34 and taken along a direction parallel to the direction of extension of the interconnect 34.

Also in the semiconductor device of this variation, the cross-sectional area of the interconnect 34 along the borderline between principal surfaces 19 and 20 is greater than the cross-sectional area of a portion of the interconnect 34 on at least part of each of non-boundary regions 9 and 10 along the interconnect width similarly to the semiconductor device illustrated in FIG. 1.

However, unlike the interconnects 31, 32, and 33 illustrated in FIG. 1, the interconnect 34 illustrated in FIG. 4 has a thick interconnect portion 34*a* that is located on a boundary region 8 of the principal surfaces 19 and 20 and is thicker than the other portions of the interconnect 34. The configuration of the semiconductor device according to this variation is similar to that of the semiconductor device illustrated in FIG. 1 except for the interconnect shape.

To fabricate the semiconductor device of this variation, base materials 1 and 2 are bonded together, and then an insulating protective film 4 is formed on a principal surface 19 of the base material 1 and a principal surface 20 of the base material 2 by, for example, spin coating. Next, an interconnect 34 made of a metal is formed on the insulating protective film 4 by a known process. To form a thick interconnect portion 34*a* of the interconnect 34, a thick interconnect, for example, is formed, a portion of the thick interconnect that will be the thick interconnect portion 34*a* is then masked by a process, such as silk screen printing, or with, for example, a photo resist, and portions of the thick interconnect except the portion thereof that will be the thick interconnect portion 34*a* are etched. Alternatively, a plating resist may be formed on each of portions of an interconnect except a portion thereof that will be the thick interconnect portion 34*a*, and in this situation, a plating may be grown on the interconnect to form the thick interconnect portion 34*a*. In the foregoing manner, the semiconductor device of this variation can be fabricated.

When the thickness of a portion of the interconnect 34 on the borderline between the principal surface 19 of the base material 1 and the principal surface 20 of the base material 2 is greater than that of a portion of the interconnect 34 on each of the non-boundary regions 9 and 10 similarly to the semiconductor device of this variation, this can also increase the cross-sectional area of the interconnect 34 along the borderline. This increase in cross-sectional area can improve the strength of the interconnect 34, and reduce the possibility that the interconnect 34 may be broken. When the width of the thick interconnect portion 34*a* on the boundary region 8 is equal to that of a portion of the interconnect 34 on each of the non-boundary regions 9 and 10, this can prevent a reduction in interconnect density.

When the thickness of each of the interconnect widening portion 31*a* of the interconnect 31 illustrated in FIG. 1, the obliquely extending portion 32*a* of the interconnect 32 illustrated therein, the branch portions 33*a* and 33*b* of the interconnect 33 illustrated therein is greater than that of a portion of a corresponding one of the interconnects on at least part of each of the non-boundary regions 9 and 10, this can further increase the cross-sectional area of the interconnect along the borderline 28. This configuration can further improve the strength of the interconnect. In particular, when the coefficient of linear expansion of the base material 1 is significantly different from that of the base material 2, such an interconnect configuration is useful.

When the thickness of a portion of each of the interconnects 44, 46, and 48, which are illustrated in FIG. 3, on the borderline 28 is greater than that of a portion of a corresponding one of the interconnects on each of the non-boundary regions 9 and 10, this can reduce the possibility that the interconnects may be broken.

—Explanation of Semiconductor Device According to First Example of Application—

A first example of application in which the configuration described with reference to FIGS. 1, 2A, and 2B is used in a semiconductor device corresponding to a fan out WLP will be described hereinafter.

Figure 5:
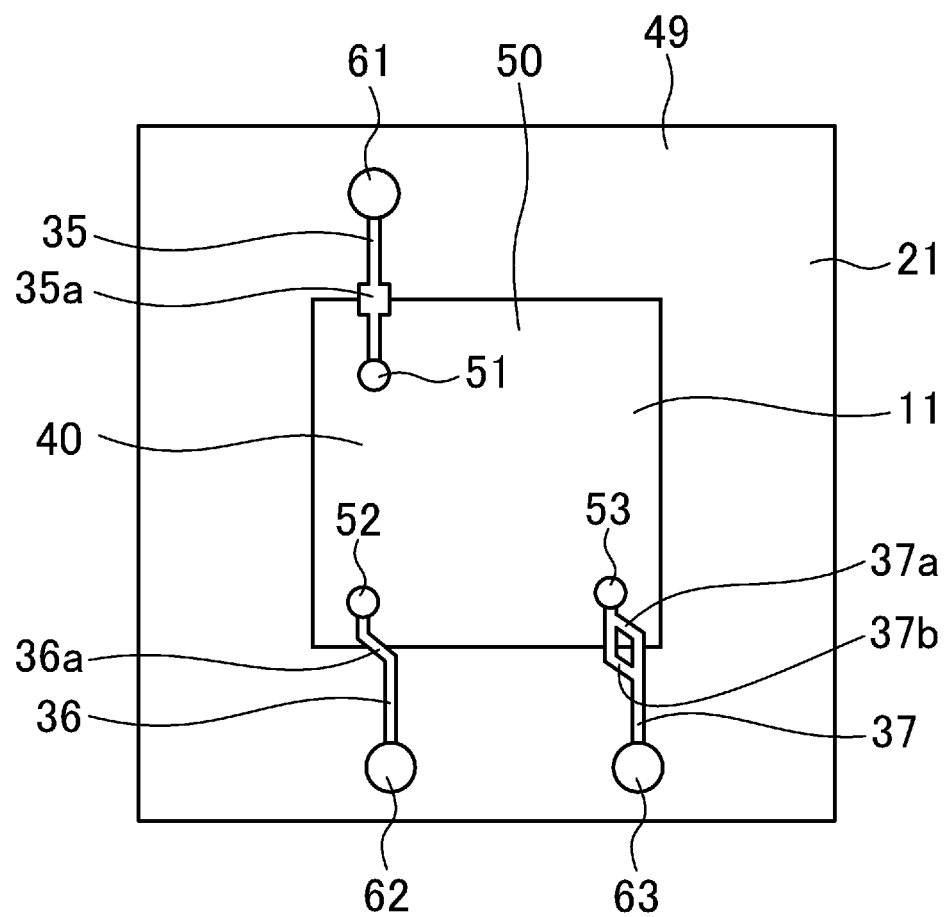
FIG. 5 is a plan view illustrating a semiconductor device according to a first example of application of the embodiment of the present disclosure.

FIG. 5 is a plan view illustrating a semiconductor device according to the first example of application of the embodiment of the present disclosure. For ease of understanding, an insulating protective film is not shown in FIG. 5.

As illustrated in FIG. 5, the semiconductor device of this example of application includes an extension member 21, a semiconductor chip 11, a first insulating protective film, chip electrodes 51, 52, and 53, redistribution interconnects 35, 36, and 37, a second insulating protective film, electrodes (not shown), and electrodes 61, 62, and 63. The extension member 21 has a principal surface 49 including a recess 40. The semiconductor chip 11 is placed in the recess 40, and has a principal surface 50 that is adjacent to the principal surface 49 and faces substantially in a direction identical with the direction in which the principal surface 49 faces. The first insulating protective film is provided over the principal surfaces 49 and 50. The chip electrodes 51, 52, and 53 are provided on the principal surface 50 to pass through the first insulating protective film. The redistribution interconnects 35, 36, and 37 each straddle the borderline between the principal surfaces 49 and 50 to extend from above the principal surface 50 to above the principal surface 49. The second insulating protective film is provided over the first insulating protective film and the redistribution interconnects 35, 36, and 37. The unshown electrodes pass through the second insulating protective film.

The electrodes 61, 62, and 63 are respectively connected through the unshown electrodes to the redistribution interconnects 35, 36, and 37.

The redistribution interconnects 35, 36, and 37 are electrically connected through the chip electrodes 51, 52, and 53, respectively, to circuits (not shown) provided on the principal surface 50 of the semiconductor chip 11.

Comparison between the semiconductor device of this example of application and the semiconductor device illustrated in FIG. 1 shows that the semiconductor chip 11 corresponds to one of the base materials 1 and 2, the extension member 21 corresponds to the other one of the base materials 1 and 2, and the redistribution interconnects 35, 36, and 37 correspond to the interconnects 31, 32, and 33, respectively.

Specifically, the redistribution interconnect 35 has a wider interconnect widening portion 35a on a boundary region of the principal surface 50 of the semiconductor chip 11 and the principal surface 49 of the extension member 21 similarly to the interconnect 31. The redistribution interconnect 36 has an obliquely extending portion 36a on the boundary region of the principal surface 50 of the semiconductor chip 11 and the principal surface 49 of the extension member 21 similarly to the interconnect 32. The redistribution interconnect 37 has branch portions 37a and 37b on the boundary region of the principal surface 50 of the semiconductor chip 11 and the principal surface 49 of the extension member 21 similarly to the interconnect 33.

In the semiconductor device of this example of application, the principal surface 49 of the extension member 21 surrounds the principal surface 50 of the semiconductor chip 11 when viewed in plan.

For example, an encapsulating resin such as an epoxy resin is used as a material of the extension member 21. However, the material is not limited to the epoxy resin, and may be, for example, ceramic or glass. Alternatively, the extension member 21 may be an organic substrate.

To fabricate the semiconductor device of this example of application, an extension member 21 is first formed outward from the side surfaces of a semiconductor chip 11 (outward of the semiconductor chip 11) with a principal surface 50 of the semiconductor chip 11 exposed. In this case, the semiconductor chip 11 is entirely enclosed in a die with the principal surface 50 facing downward, and an encapsulating resin is injected into an internal space of the die to form the extension member 21. This results in the semiconductor chip 11 placed in a recess 40 of the extension member 21.

Next, chip electrodes 51, 52, and 53 are formed on the semiconductor chip 11. Thereafter, a first insulating protective film is formed over the principal surface 50 of the semiconductor chip 11 and the principal surface 49 of the extension member 21 by, for example, spin coating.

Next, portions of the first insulating protective film covering the chip electrodes 51, 52, and 53 are removed by etching to expose the chip electrodes 51, 52, and 53. Next, redistribution interconnects 35, 36, and 37 made of a metal are formed on an upper surface of the first insulating protective film by a subtractive process or an additive process to each form an optional shape. Then, electrodes 61, 62, and 63 are respectively formed on portions of the redistribution interconnects 35, 36, and 37 on the principal surface 49 of the extension member 21. Next, a second insulating protective film is formed over the electrodes 61, 62, and 63 and the first insulating protective film, and then portions of the second insulating protective film covering the electrodes 61, 62, and 63 are removed to expose the electrodes 61, 62, and 63. Subsequently, bumps (not shown) are appropriately formed on the electrodes 61, 62, and 63.

In the semiconductor device of this example of application, similarly to the semiconductor device illustrated in FIG. 1, the cross-sectional area of each of the redistribution interconnects 35, 36, and 37 along the borderline between the principal surfaces 49 and 50 is greater than the cross-sectional area of a portion of a corresponding one of the interconnects 35, 36, and 37 away from the borderline along the interconnect width. This can improve the strengths of the interconnects against strains and misalignment caused by changes in temperature due to the difference in CLE between the semiconductor chip 11 and the extension member 21. This improvement allows the reliability of the semiconductor device corresponding to a fan out WLP according to this example of application to be much higher than that of the conventional semiconductor device.

The redistribution interconnect 37 having the branch portions 37a and 37b can improve its strength against strains, and even when any one of the branch portions 37a and 37b is broken, the redistribution interconnect 37 does not become defective as long as the other one of the branch portions 37a and 37b is electrically continuous.

In the semiconductor device illustrated in FIG. 5 according to the first example of application, the shapes of the redistribution interconnects 35, 36, and 37 may be similar to those of the interconnects 44, 46, and 48, respectively, illustrated in FIG. 3.

Figure 6:
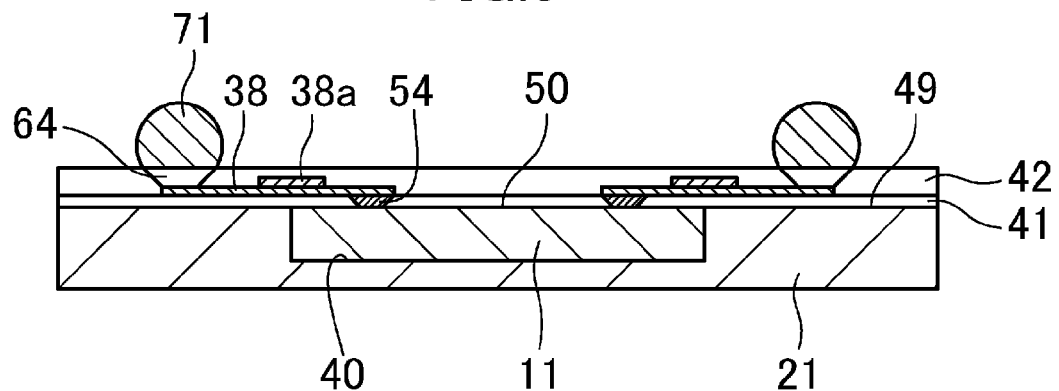
FIG. 6 is a cross-sectional view illustrating a variation of the semiconductor device illustrated in FIG. 5 according to the first example of application.

FIG. 6 is a cross-sectional view illustrating a variation of the semiconductor device illustrated in FIG. 5 according to the first example of application. In FIG. 6, the same characters as those in FIG. 5 are used to designate equivalent elements.

In the semiconductor device of this variation, redistribution interconnects 38 provide connection between chip electrodes 54 provided on a semiconductor chip 11 and electrodes 64 for connection with an external member. The electrodes 64 each pass through a second insulating protective film 42 provided on a first insulating protective film 41. Bumps 71 that are, for example, solder balls are each provided on a corresponding one of the electrode 64.

As illustrated in FIG. 6, unlike the semiconductor device illustrated in FIG. 5, in the semiconductor device of this variation, the redistribution interconnects 38 each have a thick interconnect portion 38a on a boundary region including the borderline between the principal surfaces 49 and 50. The thick interconnect portion 38a is thicker than the other portions of the redistribution interconnect 38.

To fabricate the semiconductor device of this variation, similarly to the fabrication method for the semiconductor device illustrated in FIG. 5, a first insulating protective film 41 is first formed over a principal surface 50 of a semiconductor chip 11 and a principal surface 49 of an extension member 21, and then chip electrodes 54 are formed on the principal surface 50. The chip electrodes 54 may be formed, for example, on an outer region of the semiconductor chip 11.

Next, redistribution interconnects 38 each having a thick interconnect portion 38a are formed on the first insulating protective film 41. To form the thick interconnect portion 38a, for example, a uniformly thick redistribution interconnect may be formed, a portion of the thick redistribution interconnect that will be the thick interconnect portion 38a may be then masked by a process, such as silk screen printing, or with, for example, a photo resist, and the thickness of each of portions of the thick redistribution interconnect except the portion of the thick redistribution interconnect that will be the thick interconnect portion 38a may be reduced by etching. Alternatively, after a redistribution interconnect has been formed, a plating resist may be formed on each of portions of the redistribution interconnect except a portion thereof that will be the thick interconnect portion 38a, and in this situation, a plating may be grown on the redistribution interconnect to form the thick interconnect portion 38a.

Thereafter, an electrode 64 is formed on a portion of each of the redistribution interconnects 38 on the principal surface 49 of the extension member 21. The electrode 64 is an electrode for electrical continuity with an external member. Next, a second insulating protective film 42 is formed over the electrode 64 and the first insulating protective film 41. Subsequently, portions of the second insulating protective film 42 covering the electrodes 64 are removed by etching to expose the electrodes 64. Next, a metal layer, such as an under barrier metal (UBM) layer, is formed on each of the exposed electrodes 64, and a bump 71 that is, for example, a solder ball is formed on the metal layer, thereby forming a semiconductor device corresponding to a fan out WLP according to this variation.

When the thickness of a portion of each of the redistribution interconnects 38 on the borderline between the principal surfaces 49 and 50 is increased similarly to the semiconductor device of this variation, this also allows the cross-sectional area of the redistribution interconnect 38 (the thick interconnect portion 38a) along the borderline to be greater than the cross-sectional area of a portion of the redistribution interconnect 38 away from the borderline along the interconnect width. This can improve the strength of the redistribution interconnect 38, and thus, reduce the possibility that the redistribution interconnect 38 may be broken.

When, similarly to the redistribution interconnects 38, the thickness of each of the interconnect widening portion 35a of the redistribution interconnect 35 illustrated in FIG. 5, the obliquely extending portion 36a of the redistribution interconnect 36 illustrated therein, the branch portions 37a and 37b of the redistribution interconnect 37 illustrated therein is greater than that of each of the other portions of a corresponding one of the redistribution interconnects, this can further improve the strengths of the redistribution interconnects 35, 36, and 37. Thus, even when the coefficient of linear expansion of the semiconductor chip 11 is significantly different from that of the extension member 21, breaks in the redistribution interconnects can be efficiently reduced.

While FIG. 6 illustrates an example in which the principal surface 49 of the extension member 21 is flush with the principal surface 50 of the semiconductor chip 11, the configurations of the principal surfaces 49 and 50 are not limited to this example. As long as the difference in height between the principal surfaces 49 and 50 is less than or equal to the thickness of the first insulating protective film 41 (10 μm or less), the redistribution interconnects 38 can be formed. In this case, even with a difference in height between the principal surfaces 49 and 50, the formation of a thicker first insulating protective film 41 allows an upper surface of the first insulating protective film 41 to be flat enough to form the redistribution interconnects 38. When the height of the principal surface 49 is different from that of the principal surface 50, the phrase "the borderline between the principal surfaces 49 and 50" in the above description denotes "the borderline between the principal surfaces 49 and 50 when viewed in plan."

—Explanation of Semiconductor Device According to Second Example of Application—

Figure 7:
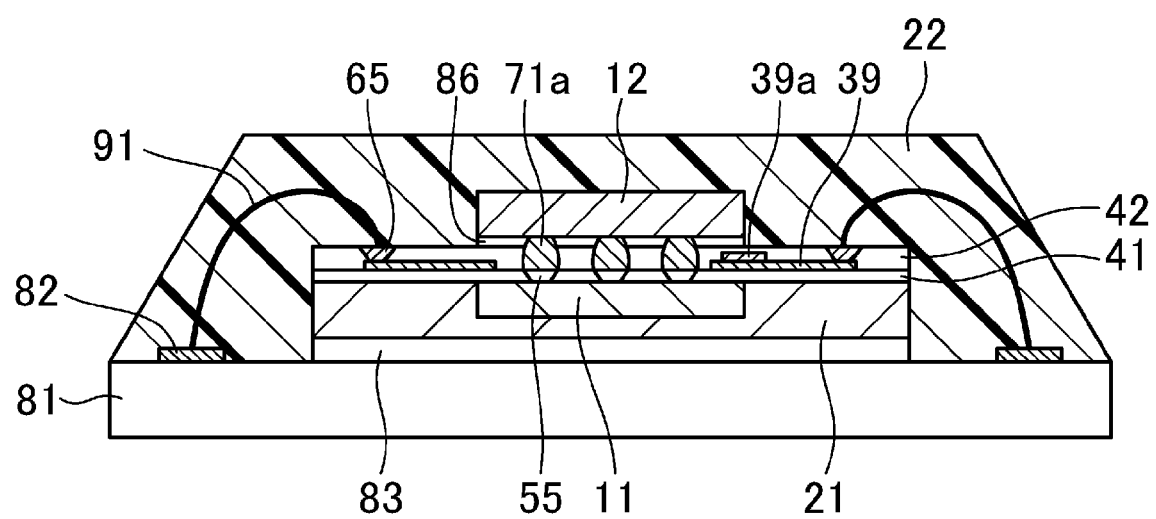
FIG. 7 is a cross-sectional view illustrating a semiconductor device according to a second example of application of the embodiment of the present disclosure.

FIG. 7 is a cross-sectional view illustrating a semiconductor device according to a second example of application of the embodiment of the present disclosure. The semiconductor device of this example of application is a system-in-package (SiP) including the fan out WLP illustrated in FIG. 5 or 6. At least one of redistribution interconnects 39 illustrated in FIG. 7 may have a thick interconnect portion 39a, or may have an interconnect widening portion, an obliquely extending portion, or branch portions similarly to any one of the redistribution interconnects 35, 36, and 37 illustrated in FIG. 5. Chip electrodes each configured to electrically connect circuits on a semiconductor chip 11 to the redistribution interconnects 39 are not shown.

As illustrated in FIG. 7, the semiconductor device of this example of application includes the fan out WLP illustrated in FIG. 5 or 6, a semiconductor chip 12 flip-chip bonded onto a principal surface (circuit formation surface) of the semiconductor chip 11 in the fan out WLP with a circuit formation surface of the semiconductor chip 12 facing toward the semiconductor chip 11, a substrate 81 having an upper surface on which the fan out WLP is placed with an adhesive 83 interposed between the substrate 81 and the fan out WLP, wires (connection members) 91 through each of which an electrode 65 of the fan out WLP and a land 82 provided on the substrate 81 are connected together, and an encapsulating resin 22.

In the fan out WLP illustrated in FIG. 7, no bump is formed on the electrode 65 provided on each of the redistribution interconnects 39. Electrodes 55 are formed on the circuit formation surface of the semiconductor chip 11, and bumps 71a that are, for example, solder balls provide electrical connection between circuits on the semiconductor chip 11 and circuits on the semiconductor chip 12.

The encapsulating resin 22 is provided on the upper surface of the substrate 81 to cover the side surfaces of the extension member 21, the principal surface thereof including the redistribution interconnects 39, a surface of the semiconductor chip 12 opposite to the circuit formation surface of the semiconductor chip 12, and the wires 91. An underfill material 86 is provided between the second insulating protective film 42 and the semiconductor chip 12.

To fabricate the semiconductor device of this example of application, a fan out WLP is first formed similarly to the fabrication method for the semiconductor device illustrated in FIG. 6. Here, portions of first and second insulating protective films 41 and 42 are previously removed by, for example, etching to expose electrodes 55 formed on a semiconductor chip 11.

Next, the fan out WLP (the semiconductor chip 11) and the semiconductor chip 12 are flip-chip bonded together such that their circuit formation surfaces face each other. Bumps 71a are previously formed on the semiconductor chip 12. Thus, the electrodes 55 on the semiconductor chip 11 are aligned with the bumps 71a, and the electrodes 55 and the bumps 71a are pressed against each other while being heated, thereby electrically bonding the semiconductor chip 11 to the semiconductor chip 12. The bumps 71a may be made of, for example, gold instead of solder, or may be, for example, metal posts.

Next, the fan out WLP flip-chip bonded to the semiconductor chip 12 is adhered onto a substrate 81 with an adhesive 83. Next, lands 82 provided on an upper surface of the substrate 81 are connected through wires 91 to electrodes 65 provided on a surface of the fan out WLP so as to be electrically connected to a circuit on the semiconductor chip 11.

Next, the fan out WLP, the semiconductor chip 12, and the wires 91 are encapsulated in a die with an encapsulating resin 22. Subsequently, solder balls or electrodes are placed on the back surface of the substrate 81, and consequently the semiconductor device of this example of application serves as a ball grid array (BGA) semiconductor package or a land grid array (LGA) semiconductor package.

As such, using the highly reliable fan out WLP illustrated in FIG. 5 or 6 enables the fabrication of a similarly highly reliable semiconductor package.

When the cross-sectional area of an interconnect along the borderline between different base materials is greater than that of a portion of the interconnect on each of non-boundary regions, this allows not only the semiconductor package described above but also various semiconductor devices each including a fan out WLP to have high reliability.

—Explanation of Semiconductor Device According to Third Example of Application—

Figure 8A:
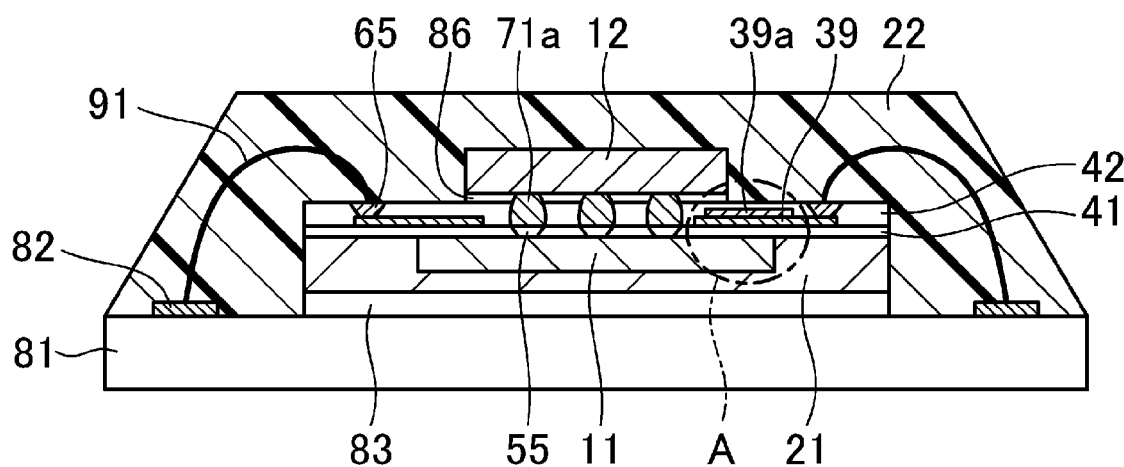
FIG. 8A is a cross-sectional view illustrating a semiconductor device according to a third example of application of the embodiment of the present disclosure.
Figure 8B:
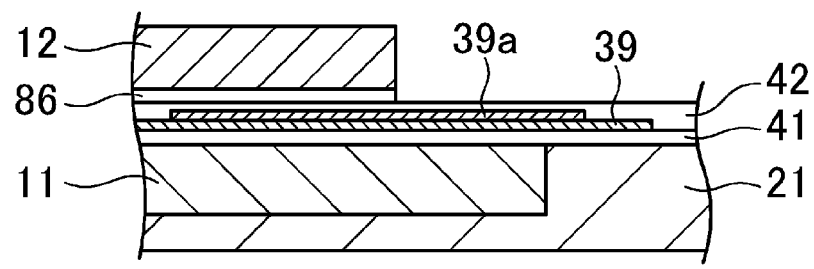
FIG. 8B is an enlarged cross-sectional view illustrating a portion A of the semiconductor device according to the third example of application.
Figure 8C:
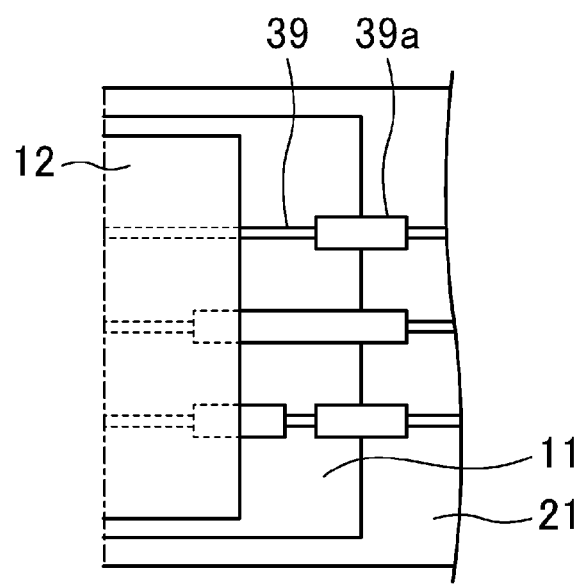
FIG. 8C is an enlarged plan view of the portion A.

FIG. 8A is a cross-sectional view illustrating a semiconductor device according to a third example of application of the embodiment of the present disclosure. FIG. 8B is an enlarged cross-sectional view illustrating a portion A of the semiconductor device according to this example of application, and FIG. 8C is an enlarged plan view of the portion A. What is illustrated in each of FIGS. 8A and 8B between a second insulating protective film 42 and a semiconductor chip 12 is an underfill material 86. In FIG. 8C, a portion of each of redistribution interconnects 39 under the semiconductor chip 12 is illustrated by the broken line.

As illustrated in FIGS. 8A-8C, in the semiconductor device of the third example of application, the area of the semiconductor chip 11 when viewed in plan is greater than that of the semiconductor chip 12 when viewed in plan, unlike the semiconductor device illustrated in FIG. 7 according to the second example of application.

When the coefficient of linear expansion of the semiconductor chip 11 is significantly different from that of an extension member 21, stress is most likely concentrated on a portion of each of the redistribution interconnects 39 of the semiconductor device of this example of application immediately above the interface between the semiconductor chip 11 and the extension member 21 as described above. Furthermore, stress tends to be concentrated also on a portion of the redistribution interconnect 39 immediately below an end surface of the upper semiconductor chip 12 due to the difference in coefficient of linear expansion between the semiconductor chip 12 and an encapsulating resin 22.

Thus, in the semiconductor device of this example of application, the cross-sectional area of a portion of each of the redistribution interconnects 39 immediately above at least the interface between the semiconductor chip 11 and the extension member 21 is greater than that of another portion thereof along the interconnect width. This efficiently reduces breaks in the interconnect.

Furthermore, as illustrated in FIG. 8C, a portion of one of the redistribution interconnects 39 extending from a region thereof immediately above the borderline between the semiconductor chip 11 and the extension member 21 to a region thereof immediately below the end surface of the semiconductor chip 12 may have a greater cross-sectional area along the interconnect width than another portion thereof. To increase the cross-sectional area of the portion of the redistribution interconnect 39, the above-described thick interconnect portion 39a may be formed, or the width of the redistribution interconnect 39 may be increased. Alternatively, a predetermined portion of the redistribution interconnect 39 including a portion thereof immediately above the interface between the semiconductor chip 11 and the extension member 21, and a predetermined portion thereof including a portion thereof immediately below the end surface of the semiconductor chip 12 may each have a greater cross-sectional area along the interconnect width than another portion thereof on which stress is not concentrated.

As such, when the width or thickness of each of the portions thereof on which stress is concentrated is greater than that of another portion thereof in a situation where stress is concentrated on a plurality of portions of each of the redistribution interconnects 39, this can more efficiently reduce ruptures or breaks in the redistribution interconnect at low cost without increasing the number of fabrication process steps.

—Explanation of Semiconductor Device According to Fourth Example of Application—

Figure 9A:
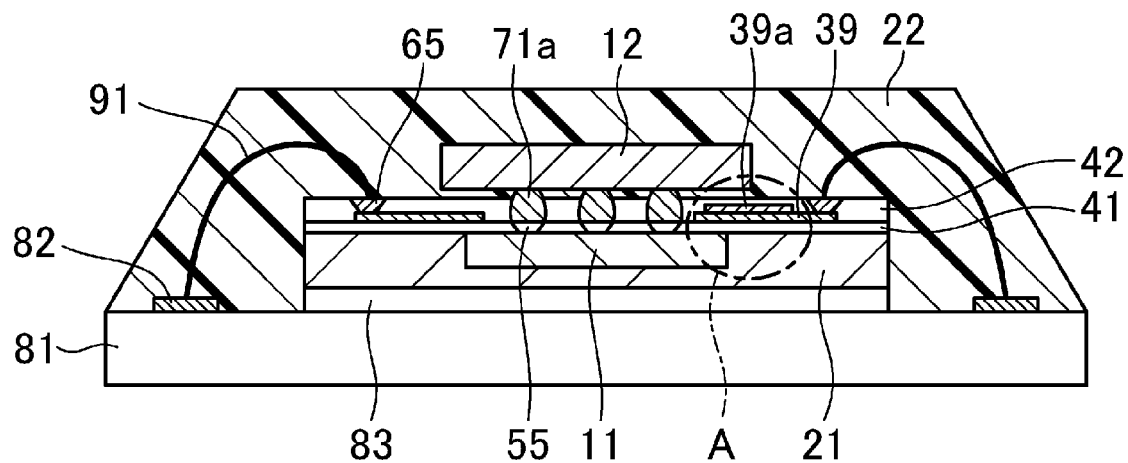
FIG. 9A is a cross-sectional view illustrating a semiconductor device according to a fourth example of application of the embodiment of the present disclosure.
Figure 9B:
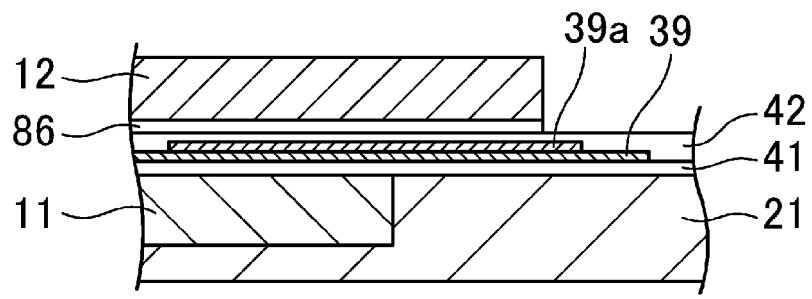
FIG. 9B is an enlarged cross-sectional view illustrating a portion A of the semiconductor device according to the fourth example of application.

FIG. 9A is a cross-sectional view illustrating a semiconductor device according to a fourth example of application of the embodiment of the present disclosure. FIG. 9B is an enlarged cross-sectional view illustrating a portion A of the semiconductor device according to this example of application, and FIG. 9C is an enlarged plan view of the portion A.

Figure 9C:
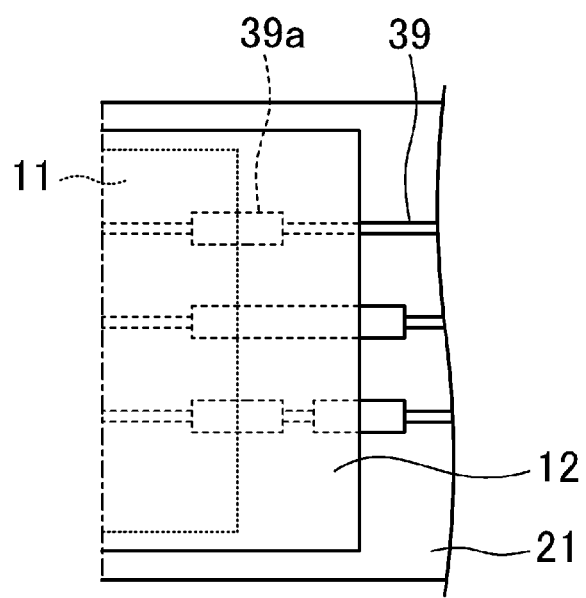
FIG. 9C is an enlarged plan view of the portion A.

As illustrated in FIGS. 9A-9C, in the semiconductor device of the fourth example of application, the area of a semiconductor chip 11 when viewed in plan is less than that of a semiconductor chip 12 when viewed in plan, unlike the semiconductor device illustrated in FIG. 7 according to the second example of application. In FIG. 9C, a portion of each of redistribution interconnects 39 under the semiconductor chip 12 is illustrated by the broken line.

When the coefficient of linear expansion of the semiconductor chip 11 is significantly different from that of an extension member 21, stress is most likely concentrated on a portion of each of the redistribution interconnects 39 of the semiconductor device of this example of application immediately above the interface between the semiconductor chip 11 and the extension member 21 as described above. Furthermore, stress tends to be concentrated also on a portion of the redistribution interconnect 39 immediately below an end surface of the upper semiconductor chip 12 due to the difference in coefficient of linear expansion between the semiconductor chip 12 and an encapsulating resin 22.

Thus, in the semiconductor device of this example of application, the cross-sectional area of a portion of each of the redistribution interconnects 39 immediately above at least the interface between the semiconductor chip 11 and the extension member 21 is greater than that of another portion thereof along the interconnect width. This efficiently reduces breaks in the interconnect.

Furthermore, as illustrated in FIG. 9C, a portion of one of the redistribution interconnects 39 extending from a region thereof immediately above the interface between the semiconductor chip 11 and the extension member 21 to a region thereof immediately below the end surface of the semiconductor chip 12 may have a greater cross-sectional area along the interconnect width than another portion thereof. To increase the cross-sectional area of the portion of the redistribution interconnect 39, the above-described thick interconnect portion 39a may be formed, or the width of the redistribution interconnect 39 may be increased. Alternatively, a predetermined portion of the redistribution interconnect 39 including a portion thereof immediately above the interface between the semiconductor chip 11 and the extension member 21, and a predetermined portion thereof including a portion thereof immediately below the end surface of the semiconductor chip 12 may each have a greater cross-sectional area along the interconnect width than another portion thereof on which stress is not concentrated.

As such, when the width or thickness of each of the portions thereof on which stress is concentrated is greater than that of another portion thereof in a situation where stress is concentrated on a plurality of portions of each of the redistribution interconnects 39, such as a situation where the size of the semiconductor chip 11 when viewed in plan is different from that of the semiconductor chip 12 when viewed in plan, this can more efficiently reduce ruptures or breaks in the redistribution interconnect at low cost without increasing the number of fabrication process steps.

The present disclosure is not limited to the embodiment described above, its variations, and the examples of application, and various changes and modifications can be made to the configurations of semiconductor devices according to the embodiment, the variations, and the examples of application without departing from the scope and spirit of the present disclosure.

An example semiconductor device according to the present disclosure can be used as a device having an interconnect formed over base materials with different coefficients of linear expansion to straddle the borderline between the base materials. The example semiconductor device according to the present disclosure is useful for, for example, SiPs each including a fan out WLP, and various electronic devices each including a SiP.

What is claimed is:

1. A semiconductor device comprising:
a first base material having a first surface on which a circuit is formed;
a second base material having a coefficient of linear expansion different from that of the first base material, being in contact with the first base material, and having a second surface being adjacent to the first surface and facing in a direction identical with a direction in which the first surface faces; and
a first interconnect formed over the first and second surfaces to straddle a first borderline between the first and second base materials when viewed in plan, and connected to the circuit formed on the first surface, wherein
a cross-sectional area of the first interconnect along the first borderline is greater than a cross-sectional area of at least part of a portion of the first interconnect on the first surface along a width of the first interconnect, or a cross-sectional area of at least part of a portion of the first interconnect on the second surface along the width of the first interconnect.

2. The semiconductor device of claim 1, wherein
a width of a portion of the first interconnect on the first borderline is greater than each of a width of at least part of the portion of the first interconnect on the first surface and a width of at least part of the portion of the first interconnect on the second surface.

3. The semiconductor device of claim 1, wherein
a thickness of a portion of the first interconnect on the first borderline is greater than each of a thickness of at least part of the portion of the first interconnect on the first surface and a thickness of at least part of the portion of the first interconnect on the second surface.

4. The semiconductor device of claim 1, wherein
a direction of extension of a portion of the first interconnect straddling the first borderline is not orthogonal to the first borderline.

5. The semiconductor device of claim 1, wherein
the first interconnect branches into a plurality of interconnects on the first borderline.

6. The semiconductor device of claim 1, wherein
the first base material is a first semiconductor chip,
the second base material is an extension member located outward from a side surface of the first semiconductor chip,
an insulating protective film is provided over the first and second surfaces, and
the first interconnect is provided on the insulating protective film.

7. The semiconductor device of claim 6, wherein
the second surface of the extension member has a recess, and
the first semiconductor chip is placed in the recess.

8. The semiconductor device of claim 6 further comprising:
a substrate having an upper surface on which the first semiconductor chip and the extension member are placed with the first and second surfaces facing upward;
a second semiconductor chip having a third surface on which a circuit is formed, and placed above the first surface of the first semiconductor chip with the third surface facing toward the first surface;
a first connection member provided between the first and second semiconductor chips so as to be electrically connected to the circuit formed on the first surface; and
an encapsulating resin provided on the upper surface of the substrate to cover a side surface of the extension member, the second surface, a side surface of the second semiconductor chip, and a surface of the second semiconductor chip opposite to the third surface.

9. The semiconductor device of claim 8 further comprising:
a first electrode provided on a portion of the first interconnect on the second surface;
a second electrode provided on the upper surface of the substrate; and
a second connection member through which the first and second electrodes are connected together and which is covered with the encapsulating resin.

10. The semiconductor device of claim 6, wherein the extension member is an encapsulating resin body, an organic substrate, a ceramic substrate, or a glass substrate.

11. The semiconductor device of claim 6, wherein
a second borderline is formed between the first semiconductor chip and the extension member to extend in a direction different from a direction of extension of the first borderline when viewed in plan,
a second interconnect is provided over the first and second surfaces so as to be electrically connected to the circuit formed on the first surface and to straddle the second borderline, and
a cross-sectional area of the second interconnect along the second borderline is greater than each of a cross-sectional area of at least part of a portion of the second interconnect on the first surface along a width of the second interconnect, and a cross-sectional area of at least part of a portion of the second interconnect on the second surface along the width of the second interconnect.

12. The semiconductor device of claim 1, wherein
the first interconnect has a boundary region including a portion of the first interconnect on the first borderline, and a non-boundary region, and
a cross-sectional area of the first interconnect along the first borderline is greater than each of a cross-sectional area of a portion of the non-boundary region on the first surface along the width of the first interconnect, and a cross-sectional area of a portion of the non-boundary region on the second surface along the width of the first interconnect.

13. A semiconductor device comprising:
a first base material having a first surface on which a circuit is formed;

a second base material having a coefficient of linear expansion different from that of the first base material, being in contact with the first base material, and having a second surface being adjacent to the first surface and facing in a direction identical with a direction in which the first surface faces; and an interconnect formed over the first and second surfaces to straddle a borderline between the first and second base materials when viewed in plan, and electrically connected to the circuit formed on the first surface, wherein a thickness of a portion of the interconnect on the borderline is greater than a thickness of at least part of a portion of the interconnect on the first surface, or a thickness of at least part of a portion of the interconnect on the second surface.

14. A semiconductor device comprising:

a first base material having a first surface on which a circuit is formed;

a second base material having a coefficient of linear expansion different from that of the first base material, being in contact with the first base material, and having a second surface being adjacent to the first surface and facing in a direction identical with a direction in which the first surface faces; and an interconnect formed over the first and second surfaces to straddle a borderline between the first and second base materials when viewed in plan, and electrically connected to the circuit formed on the first surface, wherein the interconnect branches into a plurality of interconnects on the borderline.

15. The semiconductor device of claim 13, wherein the first base material is a first semiconductor chip, the second base material is an extension member located outward from a side surface of the first semiconductor chip, an insulating protective film is provided over the first and second surfaces, and the first interconnect is provided on the insulating protective film.

16. The semiconductor device of claim 15 further comprising:

a substrate having an upper surface on which the first semiconductor chip and the extension member are placed with the first and second surfaces facing upward;

a second semiconductor chip having a third surface on which a circuit is formed, and placed above the first surface of the first semiconductor chip with the third surface facing toward the first surface;

a connection member provided between the first and second semiconductor chips so as to be electrically connected to the circuit formed on the first surface; and an encapsulating resin provided on the upper surface of the substrate to cover a side surface of the extension member, the second surface, a side surface of the second semiconductor chip, a surface of the second semiconductor chip opposite to the third surface, and the connection member.

17. The semiconductor device of claim 14, wherein the first base material is a first semiconductor chip, the second base material is an extension member located outward from a side surface of the first semiconductor chip, an insulating protective film is provided over the first and second surfaces, and the first interconnect is provided on the insulating protective film.

18. The semiconductor device of claim 17 further comprising:

a substrate having an upper surface on which the first semiconductor chip and the extension member are placed with the first and second surfaces facing upward;

a second semiconductor chip having a third surface on which a circuit is formed, and placed above the first surface of the first semiconductor chip with the third surface facing toward the first surface;

a connection member provided between the first and second semiconductor chips so as to be electrically connected to the circuit formed on the first surface; and an encapsulating resin provided on the upper surface of the substrate to cover a side surface of the extension member, the second surface, a side surface of the second semiconductor chip, a surface of the second semiconductor chip opposite to the third surface, and the connection member.

19. The semiconductor device of claim 15, wherein the extension member is an encapsulating resin body, an organic substrate, a ceramic substrate, or a glass substrate.

20. The semiconductor device of claim 17, wherein the extension member is an encapsulating resin body, an organic substrate, a ceramic substrate, or a glass substrate.

* * * * *